(12) United States Patent
Berenbak et al.

(10) Patent No.: US 7,351,057 B2
(45) Date of Patent: Apr. 1, 2008

(54) DOOR PLATE FOR FURNACE

(75) Inventors: Bart Berenbak, Amsterdam (NL);
Chris G. M. de Ridder, Hoogland (NL)

(73) Assignee: ASM International N.V. (NL)

( * ) Notice: Subject to any disclaimer, the term of this patent is extended or adjusted under 35 U.S.C. 154(b) by 300 days.

(21) Appl. No.: 11/116,663

(22) Filed: Apr. 27, 2005

(65) Prior Publication Data
US 2006/0243269 A1    Nov. 2, 2006

(51) Int. Cl.
*F27D 1/18*    (2006.01)
(52) U.S. Cl. ...................... 432/250; 432/242
(58) Field of Classification Search ............ 432/250, 432/56, 57, 237, 242; 110/173 R
See application file for complete search history.

(56) References Cited

U.S. PATENT DOCUMENTS

| | | | | |
|---|---|---|---|---|
| 4,596,526 A | * | 6/1986 | Soliman | 432/23 |
| 5,207,573 A | * | 5/1993 | Miyagi et al. | 432/182 |
| 5,330,352 A | | 7/1994 | Watanabe et al. | |
| 5,567,149 A | | 10/1996 | Hansotte et al. | |
| 5,662,470 A | * | 9/1997 | Huussen et al. | 432/241 |
| 6,164,963 A | * | 12/2000 | Weaver | 432/241 |
| 6,235,121 B1 | | 5/2001 | Honma et al. | |
| 6,316,371 B1 | | 11/2001 | Oosterlaken et al. | |
| 6,499,768 B2 | | 12/2002 | De Ridder et al. | |
| 6,503,079 B2 | * | 1/2003 | Kogano et al. | 432/242 |
| 6,709,525 B2 | | 3/2004 | Song | |
| 6,746,240 B2 | | 6/2004 | De Ridder et al. | |
| 6,957,956 B2 | * | 10/2005 | Toba et al. | 432/241 |
| 7,128,570 B2 | * | 10/2006 | Oosterlaken et al. | 432/242 |

* cited by examiner

*Primary Examiner*—Gregory Wilson
(74) *Attorney, Agent, or Firm*—Knobbe Martens Olson & Bear LLP (57) ABSTRACT

The process chamber of a vertical furnace is provided with a closure, or door, comprising an upper and a lower door plate. The upper door plate has a gas exhaust opening proximate its center, thereby allowing for a symmetrical flow of process gases through the process chamber and into the gas exhaust opening. The upper door plate is spaced from the lower door plate to form a sealing chamber, which is purged with inert gas. Optionally, both the gas exhaust opening and the sealing chamber empty into a gas exhaust channel formed inside the upper door plate. The gas exhaust channel leads to an exhaust which exhausts gases from the furnace and separates the flow path of corrosive process gases from surfaces of the lower door plate, which may be formed of relatively easily-corroded metal.

32 Claims, 6 Drawing Sheets

DOOR PLATE FOR FURNACE

CROSS-REFERENCE TO RELATED APPLICATIONS

This application is related to: U.S. patent application Ser. No. 11/038,357, entitled METHOD FOR PURGING SEALS IN A THERMAL REACTOR, filed Jan. 18, 2005; and U.S. patent application Ser. No. 11/049,048, entitled METHOD FOR PROCESSING SEMICONDUCTOR SUBSTRATES, filed Feb. 1, 2005. The entire disclosures of these applications are incorporated herein by reference.

BACKGROUND OF THE INVENTION

1. Field of the Invention

This invention relates to semiconductor processing and, more particularly, to furnaces used for semiconductor processing.

2. Description of the Related Art

During semiconductor manufacturing, vertical furnaces are commonly used to subject semiconductor substrates, such as wafers, to a number of processing steps, including oxidation and diffusion steps, at elevated temperatures. A heat resistant material in the shape of a cylindrical tube can be used to form the interior walls of the furnaces. The lower end of a vertical furnace reaction tube is typically open to allow loading and unloading of a substrate holder, e.g., a wafer boat, which typically holds a plurality of substrates. During processing, the lower end of the reaction tube can be sealed by a movable closure.

Figure 1:
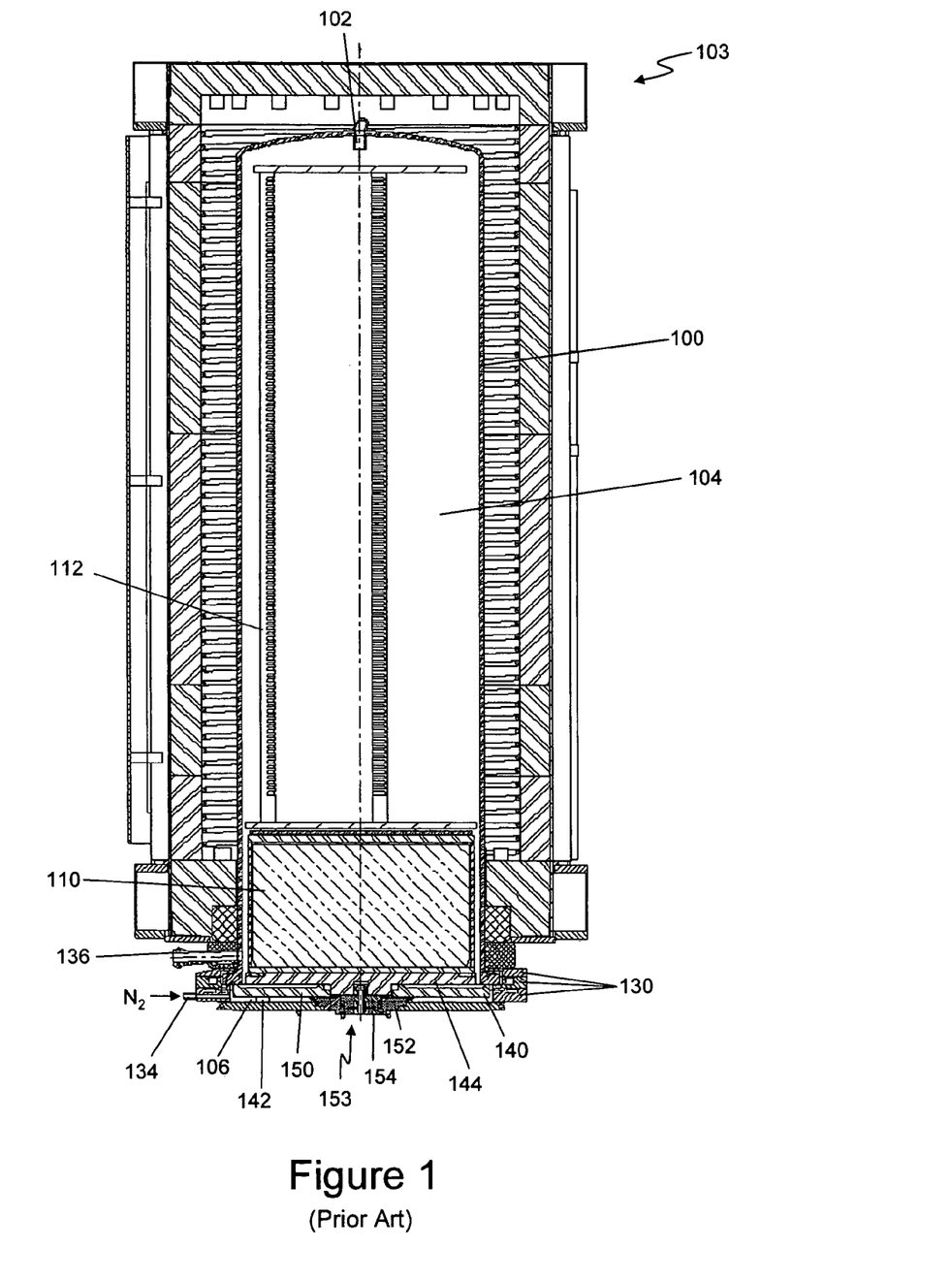
FIG. 1 is a schematic, cross-sectional side view of a furnace having a closure construction according to the prior art.
Figure 2:
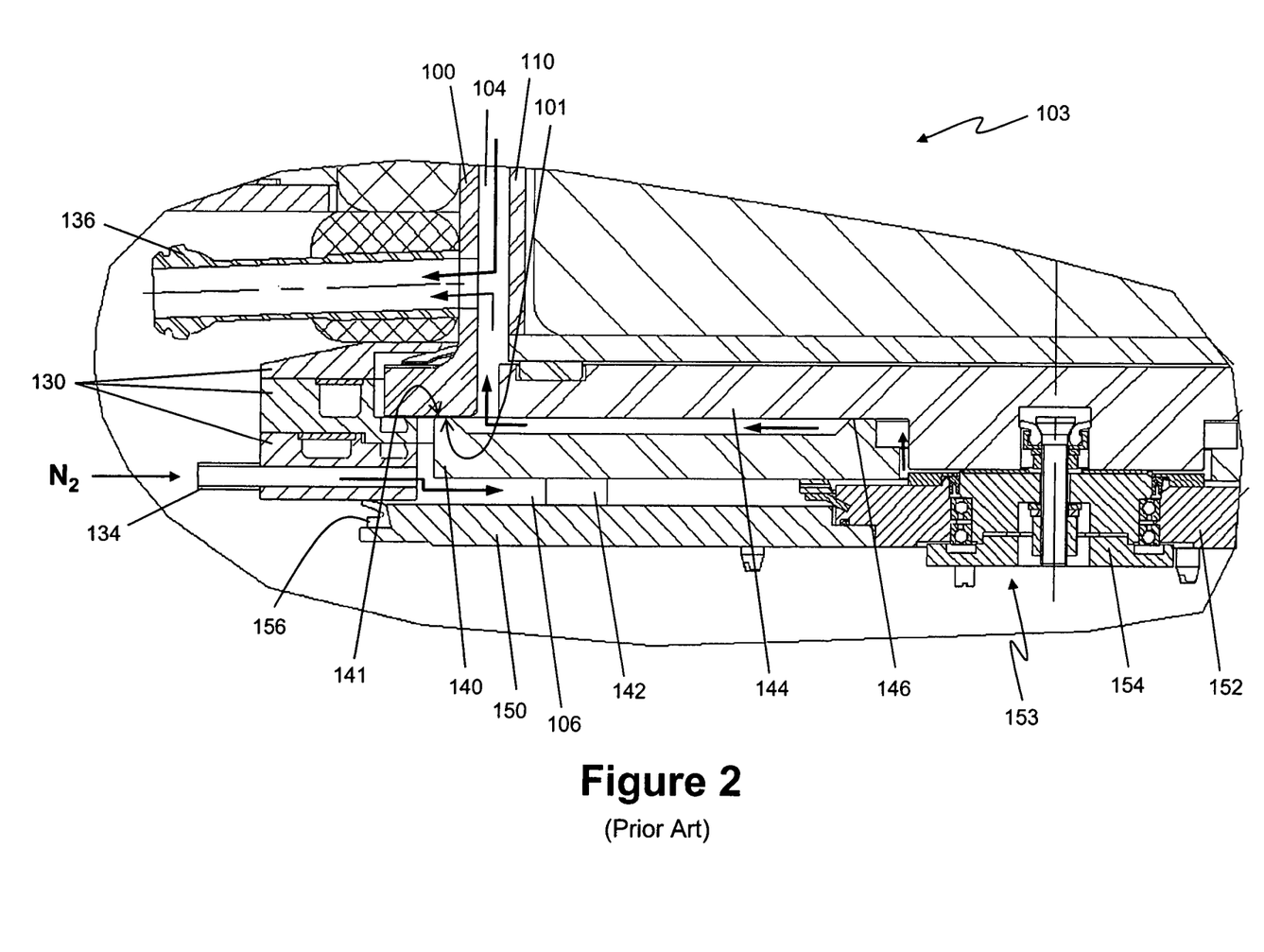
FIG. 2 is a schematic, cross-sectional side view of a detail of a lower section of the furnace of FIG. 1.

An example of a vertical furnace 103 is shown in FIGS. 1 and 2, wherein identical parts are indicated by identical reference numbers. With reference to FIG. 1, a process tube 100 is supported at its lower end on flanges 130. The open bottom end of the process tube 100 can be closed by positioning a door plate 140 against the process tube 100. A preferred material for the process tube 100 and the door plate 140 is quartz, because of its purity and high temperature resistance. When closed, the process tube 100 and the door plate 140 delimit a reaction, or process, chamber 104. It will be appreciated that process gas flows into the reaction chamber 104 through a process gas inlet 102 and then flows downward and exits the chamber 104 out of a gas exhaust 136, which is a gas passage in the process tube 100 near the open end of the tube 100.

The quartz door plate 140 rests on three or more feet 142, which in turn rest on a metal door plate 150. In the illustrated example, the metal door plate 150 is provided with a rotation bearing 153, which allows a wafer boat 112 to rotate during processing. Part 152 is the stationary part and part 154 is the rotating part of the rotation bearing 153. A rotating support plate 144 rests on the rotation bearing 153 and supports a pedestal 110, which in turn supports the wafer boat 112.

With reference to FIG. 2, closing the process tube 100 involves forming a quartz-to-quartz seal between the process tube 100 and the door plate 140. The door plate 140 comprises an upper sealing surface 141 that abuts a lower sealing surface 101 of the process tube 100 and, thus, forms a quartz-to-quartz seal. However, quartz contacting quartz does not make for a completely airtight seal. Aggressive process chemicals, such as HCl, can diffuse through the quartz-to-quartz seal and undesirably contact and corrode the metal door plate 150 and/or leak out of the furnace 103.

To minimize this corrosion and gas leakage, a lower sealing chamber 106 can be formed at the lower end of the process chamber 104, immediately below the quartz door plate 140. The lower wall of the sealing chamber 106 is formed by the metal door plate 150 and the sealing chamber 106 is sealed from the outside world by resilient sealing members such as O-rings or lip-seals 156.

Inert purge gas is flowed into the sealing chamber 106 through an inlet 134 to expel process gases that diffuse through the quartz-to-quartz seal and to prevent process gases, such as HCl, from reaching the metal door plate 150 and corroding the metal material of the plate 150. The flow of a purge gas, e.g., $N_2$, is shown by arrows, starting from the inlet 134. The purge gas flows through the sealing chamber 106 in a generally radially inward direction until, in a center region of the quartz door plate 140, the purge gas leaves the sealing chamber 106 and enters the process chamber 104 by flowing upward and radially outward past a flow restriction 146, which restricts the flow of gas by decreasing the cross-sectional area of the passage through which the gas flows. Then, the purge gas flows in the direction of an exhaust 136.

While effective at minimizing door plate corrosion and process gas leakage, flowing inert gas through the sealing chamber 106 has been observed to detrimentally affect process results on substrates processed in the reaction chamber 104.

Accordingly, there is a need for a furnace closure and exhaust construction that allows purging of a sealing chamber, while also minimizing the effects of the purge on process results.

SUMMARY OF THE INVENTION

According to one aspect of the invention, a furnace is provided for semiconductor processing. The furnace comprises a reaction chamber at least partially delimited by a vertically-extending process tube sized and shaped to accommodate a plurality of vertically separated semiconductor substrates. The process tube is provided with a feed for gas and has an open end. Walls of the process tube proximate the open end are free of passages for exhausting gas. The furnace also comprises a process tube closure configured to reversibly seal against the process tube to close off the open end. The closure comprises a first door plate having one or more gas exhaust openings. The gas exhaust openings are disposed proximate a center of the first door plate and are configured to exhaust gases from the reaction chamber.

According to another aspect of the invention, a closure for a semiconductor processing furnace is provided. The closure comprises a first door plate configured to seal against a process tube of the furnace. The closure also comprises a second door plate below and vertically spaced from the first door plate by one or more spacers. The first and second door plates define a sealing chamber therebetween. The sealing chamber has an inlet and an outlet proximate perimeters of the first and second doors.

According to yet another aspect of the invention, a door construction for a reaction tube of a semiconductor processing furnace is provided. The door construction comprises a door plate configured to seal against a surface on a bottom portion of the reaction tube. The door plate comprises one or more gas channels extending inside the door plate from proximate a center of the door plate to a termination proximate the perimeter of the door plate.

According to another aspect of the invention, a method for semiconductor processing is provided. The method comprises providing a plurality of vertically separated substrates in a reaction chamber of a furnace. A gas is flowed into the reaction chamber via a gas inlet. The gas is flowed downward through the reaction chamber past the substrates. Subsequently, the gas is flowed radially inward below the substrates and into a gas exhaust opening.

BRIEF DESCRIPTION OF THE DRAWINGS

The invention will be better understood from the detailed description of the preferred embodiments and from the appended drawings, which are meant to illustrate and not to limit the invention, and wherein.

DETAILED DESCRIPTION OF THE PREFERRED EMBODIMENT

It has been found that the poor process results in some furnaces, such as those illustrated in FIGS. 1 and 2, are caused by several problems stemming from the design of the furnaces and their closures. First, with reference to FIGS. 1 and 2, where the purge gas in the sealing chamber 106 is lighter than the process gas, buoyancy effects can occur if the purge gas leaks into the process chamber 104. For example, this is the case when the process gas is $O_2$, having a molecular weight of 32, and the purge gas is $N_2$, having a molecular weight of 28. When the purge gas reaches the area in which the substrates are placed, the purge gas can detrimentally influence the uniformity of processes by traveling through the reaction chamber 104 and diluting the process gas. "Bubbles" of purge gas can rise in the process tube 100 and persist, especially at heights near or above the opening of the process gas inlet 102. The purge gas can move through the reaction chamber 104 along particular paths and may persist at the top of the reaction chamber, thereby non-uniformly affecting process gas concentrations and, in turn, adversely affecting the uniformity of process results. Such a problem is described in U.S. patent application Ser. Nos. 11/038,357 and 11/049,048, the entire disclosures of which are incorporated herein by reference.

A second problem is that the purge gas can contaminate the chamber 104 by moving particles from the sealing chamber 106 to the reaction chamber 104. This is especially a problem with door plates 140, 150 that are provided with a boat rotation feed-through, as in the example shown in FIGS. 1 and 2. Rotation of the rotational bearing 153 is prone to generating particles, which can be picked up by the purge gas and introduced into the reaction chamber 104.

Another disadvantage of furnaces such as that illustrated in FIGS. 1 and 2 is that the opening of the exhaust 136 is positioned at a single point at the circumference of the process tube 100. This positioning causes an asymmetric gas flow as process gases from all parts of the chamber 104 approach the same exhaust 136. This asymmetric flow also adversely affects process results.

Advantageously, preferred embodiments of the invention allow the sealing chamber to be purged while substantially preventing leakage of the purge gas into the reaction area and also allows a more symmetrical flow pattern of process gas through the process chamber to the gas exhaust. Preferably, the opening(s) to an exhaust are positioned proximate a center of the closure, e.g., a door plate, for a process tube. The door plate and the supports for a wafer boat are constructed so that process gas flows downward through a process chamber and then inward from the sides of the chamber to the central gas exhaust opening. The opening leads to a sealing chamber, which is connected to a gas exhaust. In addition to allowing a more uniform flow of process gas to the gas exhaust opening, the pressure of process gas in the exhaust opening advantageously minimizes leakage of purge gas from the sealing chamber into the process chamber.

In addition, in some preferred embodiments, the process tube closure comprises more than one door plate, e.g., a first door plate above a second door plate. An exhaust channel separate from the sealing chamber is provided inside the upper door plate, which is preferably formed of highly corrosion-resistant material. The exhaust opening in the process chamber is in gas communication with the exhaust channel, which is connected to the gas exhaust for removing gas from the furnace. A sealing chamber is formed between the upper door plate and the lower door plate. Advantageously, by flowing process gas through an exhaust channel separate from the sealing chamber, corrosion of the lower door plate by process gases is minimized. Moreover, as noted above, the downward flow of the process gas in the exhaust opening can minimize leakage of purge gas from the sealing chamber to the process chamber. It will be appreciated that the purge gas is preferably a relatively inert gas, e.g., $N_2$, and the process gas is a gas to which substrates are desirably exposed.

Reference will now be made to the Figures, in which like reference numerals refer to like parts throughput.

Figure 3:
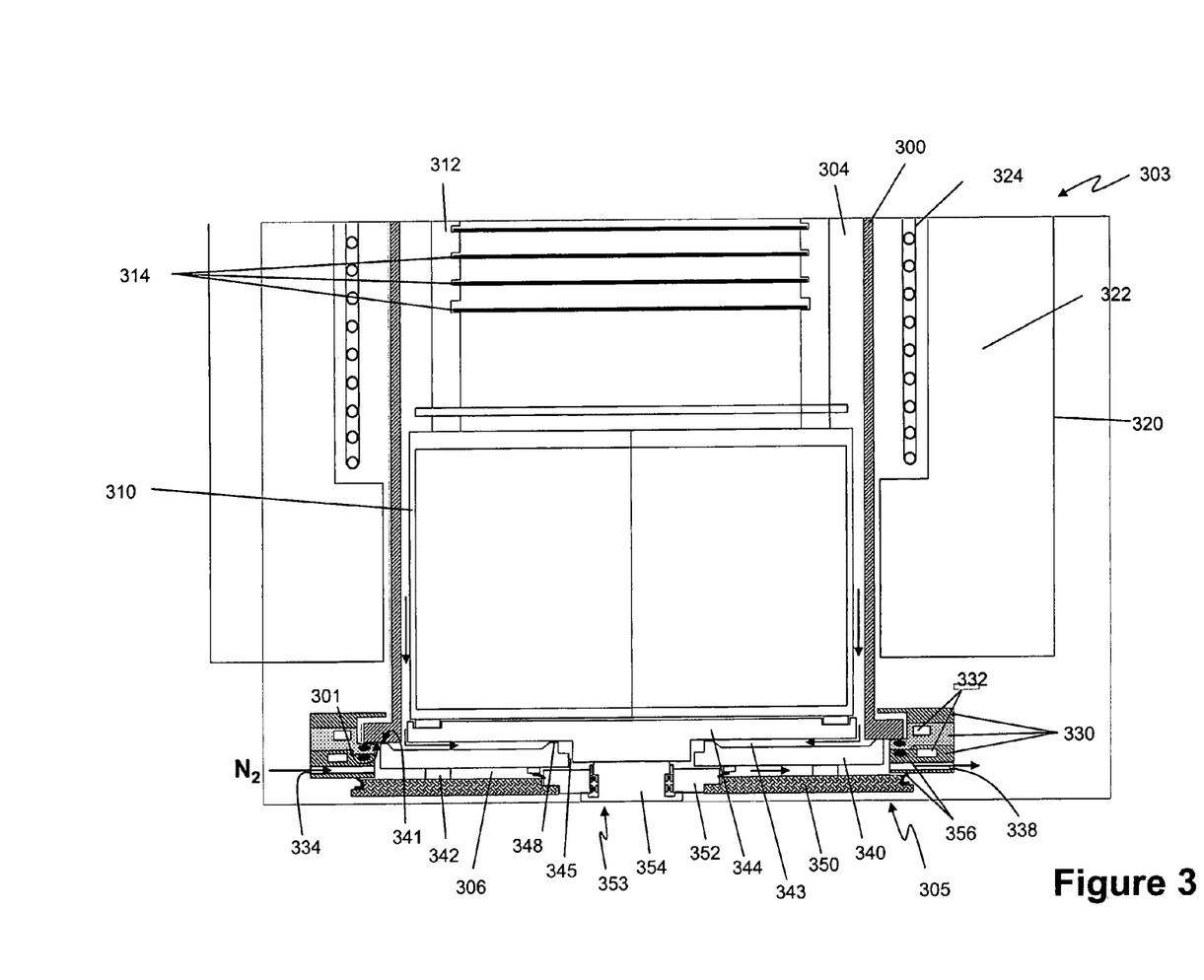
FIG. 3 is a schematic, cross-sectional side view of a furnace having a closure construction in accordance with preferred embodiments of the invention.

FIG. 3 shows the lower part of a furnace 303 having a furnace closure 305 according to preferred embodiments of the invention. The furnace 303 comprises a process tube 300 surrounded by a heating coil 324, insulating material 322 and a casing 320. At its lower end, the process tube 300 is supported on metal flanges 330, which can be provided with channels 332 for circulating a cooling medium therethrough. The open (lower) end of the process tube 300 is illustrated closed off by a closure 305 comprising an upper door plate 340 and a lower door plate 350. The closure 305 reversibly closes off the process tube 300, i.e., the process tube 300 can be repeatedly opened or closed by moving (lifting or dropping) the closure 305. Preferably, the upper door plate 340 is formed of a highly pure and heat resistant material, such as quartz. The upper door plate 340 comprises a protrusion having an upper surface with a sealing surface 341 that seals against, or abuts, a sealing surface 301 on a lower surface of the process tube 300, thereby forming a quartz-to-quartz seal for the illustrated materials.

With the quartz door plate 340 in the closed position, the process tube 300 and the quartz door plate 340 delimit a reaction chamber 304. To load and unload a wafer boat 312 into the process tube 300, the reaction chamber 304 can be opened by separating the quartz door plate 340 from the process tube 300. Preferably, the wafer boat 312 can accommodate a plurality of vertically separated substrates 314, e.g., semiconductor wafers.

A sealing chamber 306 is formed at the lower end of reaction chamber 304, immediately below the quartz door plate 340. The lower wall of the sealing chamber 306 is formed by the lower door plate 350, which is preferably formed of metal. Preferred metals include corrosion resistant metals such as stainless steel, Hastelloy® or Inconel®. The sealing chamber 306 is sealed from the outside world by one or more resilient sealing members, such as O-rings or lip-seals 356. The quartz door plate 340 rests on one or more, more preferably, three or more feet, or spacers, 342, which in turn are supported by the metal door plate 350.

In the illustrated example, the door plates 340 and 350 have central holes which are sized and shaped to accommodate at rotation bearing 353 and/or a downwardly extending part of the rotating support plate 344 which contacts the rotation bearing. In the illustrated embodiment, the metal door plate 350 is provided with the rotation bearing 353, which allows the wafer boat 312 to be rotated during processing. The rotation bearing 353 comprises a stationary part 352 and a rotating part 354. The rotating part 354 supports a rotating support plate 344, which supports a pedestal 310, which in turn supports the wafer boat 312.

With continued reference to FIG. 3, a flow of purge gas is fed into the sealing chamber 306 through an inlet 334 and leaves the sealing chamber 306 through a gas exhaust 338. Preferably, the purge gas inlet 334 and the gas exhaust 338 are disposed on different sides of the furnace 303, at horizontally opposite ends of the lower sealing chamber 306, i.e., at an angle of about 180° relative to one another, to obtain an optimum purging of the lower chamber. Advantageously, the purge gas picks up and expels process gases that diffuse through the quartz-to-quartz seal and prevents those gases from leaking outside of the furnace 303.

Process gas is introduced into the reaction chamber 304 though a process gas inlet (not shown) proximate the top of the furnace 303. Inside the reaction tube 300, the process gas moves in a downward direction until it comes to the quartz door plate 340, at which point it moves in a radially inward direction in a gap 343 between the quartz door plate 340 and the lower surface of the rotating quartz plate 344. The gas travels through the gap 343 towards an exhaust opening 345 proximate a center of door plate 340 and proximate a perimeter of the bearing 353. Then, the process gas travels through the sealing chamber 306 to the gas exhaust 338. Preferably, a flow restriction 348 is provided in the flow path of the process gas. The flow restriction 348 is preferably a protrusion in the door plate 340 positioned upstream of the exhaust opening 345, in order to minimize or prevent any leaks of purge gas from the sealing chamber 306 into the process chamber 304.

Advantageously, with this construction, purge gas in the sealing chamber 306 is substantially prevented from entering the reaction chamber 304. Thus, undesirable buoyancy effects, caused by purge gas of a different density than the process gas flowing through and inhomogeneously diluting the process gas, are avoided. Furthermore, the undesirable transport of particles and other contaminants from the relatively dirty sealing chamber 306 into the reaction chamber 304 is prevented. In addition, the flow path of the process gas through the chamber 304 is substantially symmetric, as the process gas flows down the sides of the process tube 300 to converge on a centrally positioned exhaust opening 345.

It will be appreciated that some processes in the reaction chamber 304 require the use of corrosive agents. For example, process gases can contain HCl and/or water and/or other corrosive components that can corrode the metal door plate 350. While many corrosion resistant metals may be suitable materials for the metal door plate 350 in the short term, it is difficult to find a metal that is sufficiently corrosion resistant that it causes no problems in the long term.

Consequently, in some preferred embodiments, the flow path of the process gas is physically separated from the lower door plate 350, thus preventing or minimizing corrosion of that door plate, which is preferably formed of metal.

Figure 4:
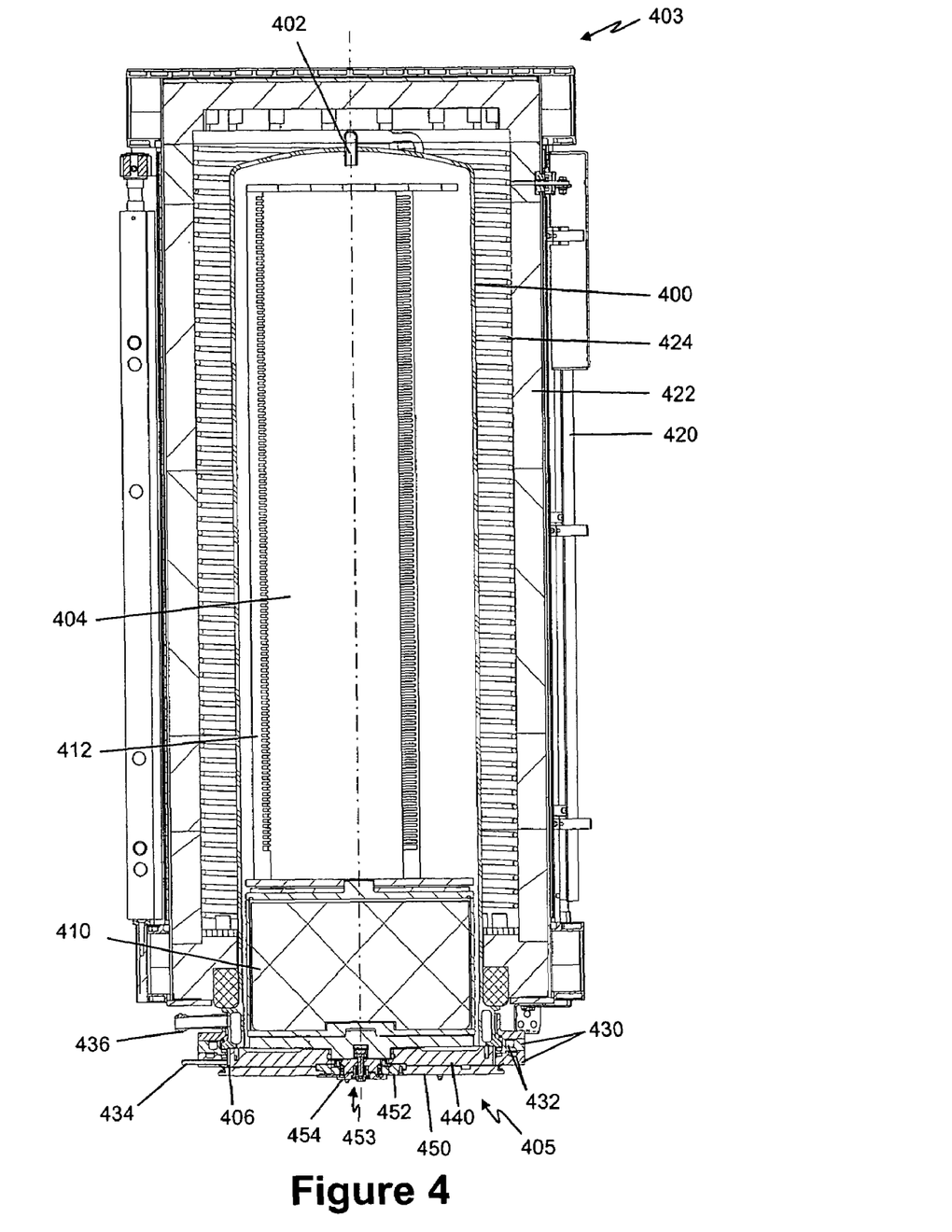
FIG. 4 is a schematic, cross-sectional side view of a furnace having another furnace closure construction in accordance with preferred embodiments of the invention.

With reference to FIG. 4, a furnace 403 comprises a process tube 400 that is surrounded by a heating coil 424, insulating material 422 and a casing 420. The process tube 400 is supported at its lower end on metal flanges 430, which are shown provided with channels 432 for circulating a cooling medium there-through.

Figure 5:
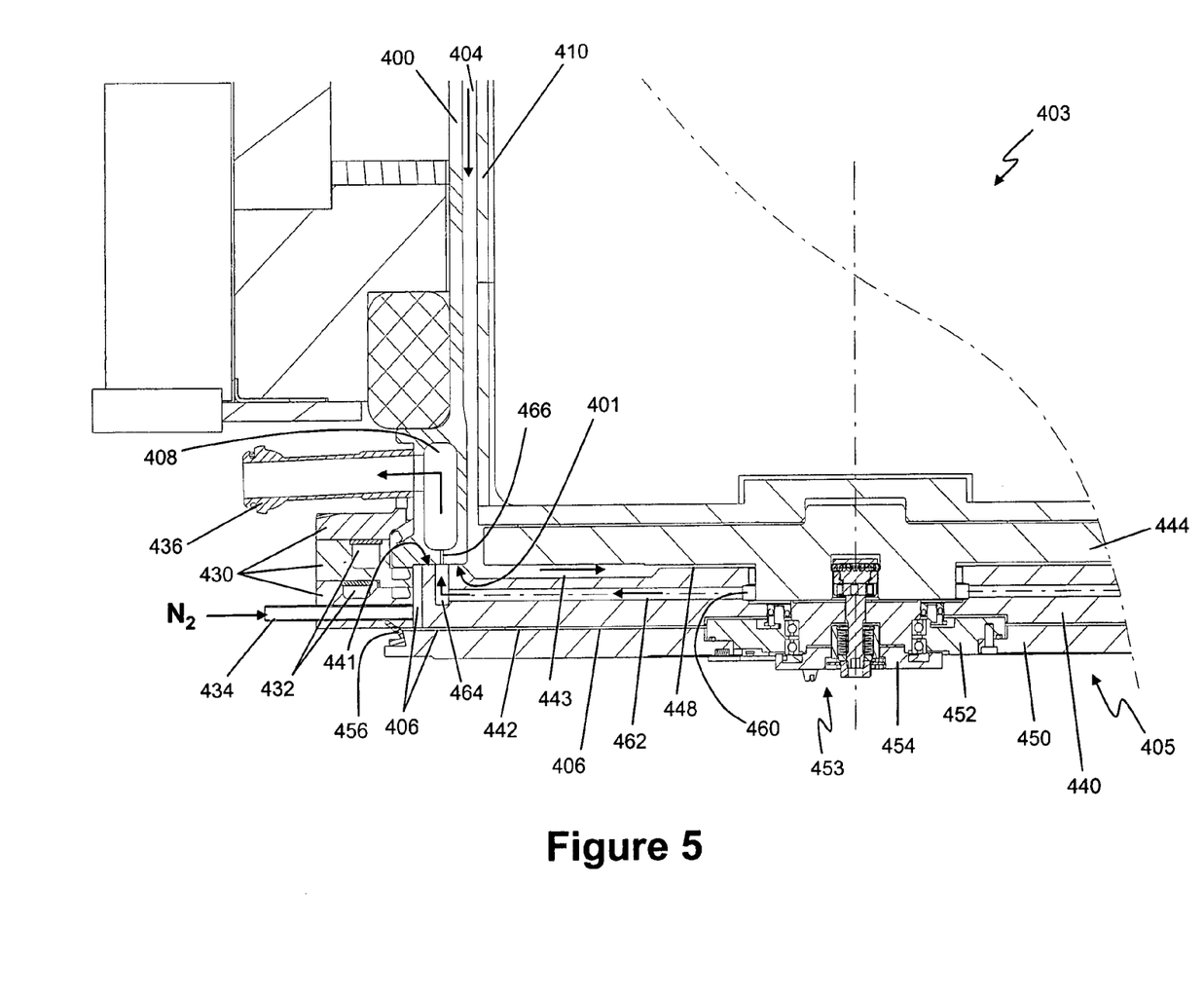
FIG. 5 is a schematic, cross-sectional side view of a detail of the furnace closure construction of FIG. 4, in accordance with preferred embodiments of the invention.

With reference to FIG. 5, showing the lower left end of the furnace of FIG. 4 in more detail, the open end of the process tube 400 is reversibly closed off by a closure 405, comprising a door plate 440, preferably formed of quartz, and a door plate 450, preferably formed of metal, such as stainless steel, Hastelloy® or Inconel®. The quartz door plate 440 has an upper surface that has a circumferential sealing surface 441 that abuts, or seals against, a lower sealing surface 401 of the process tube 400 and, thus, forms a quartz-to-quartz seal. In the illustrated closed position, the process tube 400 and the quartz door plate 440 delimit a reaction chamber 404.

A sealing chamber 406 is formed below the lower end of the reaction chamber 404, preferably immediately below and to the sides of the quartz door plate 440. The lower wall of the sealing chamber 406 is formed by the metal door plate 450 and the sealing chamber 406 is sealed from the outside world by one or more resilient sealing members, such as O-rings or lip-seals 456. With reference to FIG. 5, the volume of the sealing chamber 406 is preferably small, resulting in efficient purging while only using a limited purging flow.

The quartz door plate 440 preferably rests on the metal door plate 450 via one or more, more preferably, three or more intervening feet, or spacers, 442. In the illustrated example, the door plate 450 is provided with a hole occupied by a rotation bearing 453 for rotating a wafer boat 412 (FIG. 4) during processing. The rotation bearing 453 comprises a stationary part 452 and a rotating part 454. The rotating part 454 supports a rotating support plate 444, which supports a pedestal 410, which in turn supports the wafer boat 412 (FIG. 4), which holds a plurality of vertically separated substrates during processing.

With continued reference to FIG. 5, a flow of inert purge gas is fed into the sealing chamber 406 through the inlet 434. The purge gas repels process gas back into the process chamber 404 and/or carries away process gas that may diffuse through the quartz-to-quartz seal. Purge gas flows through the sealing chamber 406 along a gap between the door plate 440 and the rotation bearing 453 and leaves the sealing chamber 406 through one or more exhaust openings 460 disposed in a center region of the quartz door plate 440, proximate a perimeter of the bearing 453.

At least one exhaust channel 462 is provided within the quartz door plate 440. The inlet end of the exhaust channel 462 is formed by an exhaust opening 460 and the outlet end of the exhaust channel 462 (see FIG. 6) is in communication with an exhaust 436 for gases. In the illustrated example, the door plate 440 is provided with 16 radial directed exhaust channels 462 and a circumferential, annular groove 464 into which the outlet ends of exhaust channels 462 discharge. It will be appreciated that, in other embodiments, more or fewer exhaust channels 462 can be provided. Moreover, the annular groove 464 can be replaced by a plurality of separated openings, although a continuous groove is preferred for purposes of symmetry and relative ease of alignment with the opening 466 (discussed below).

Figure 6:
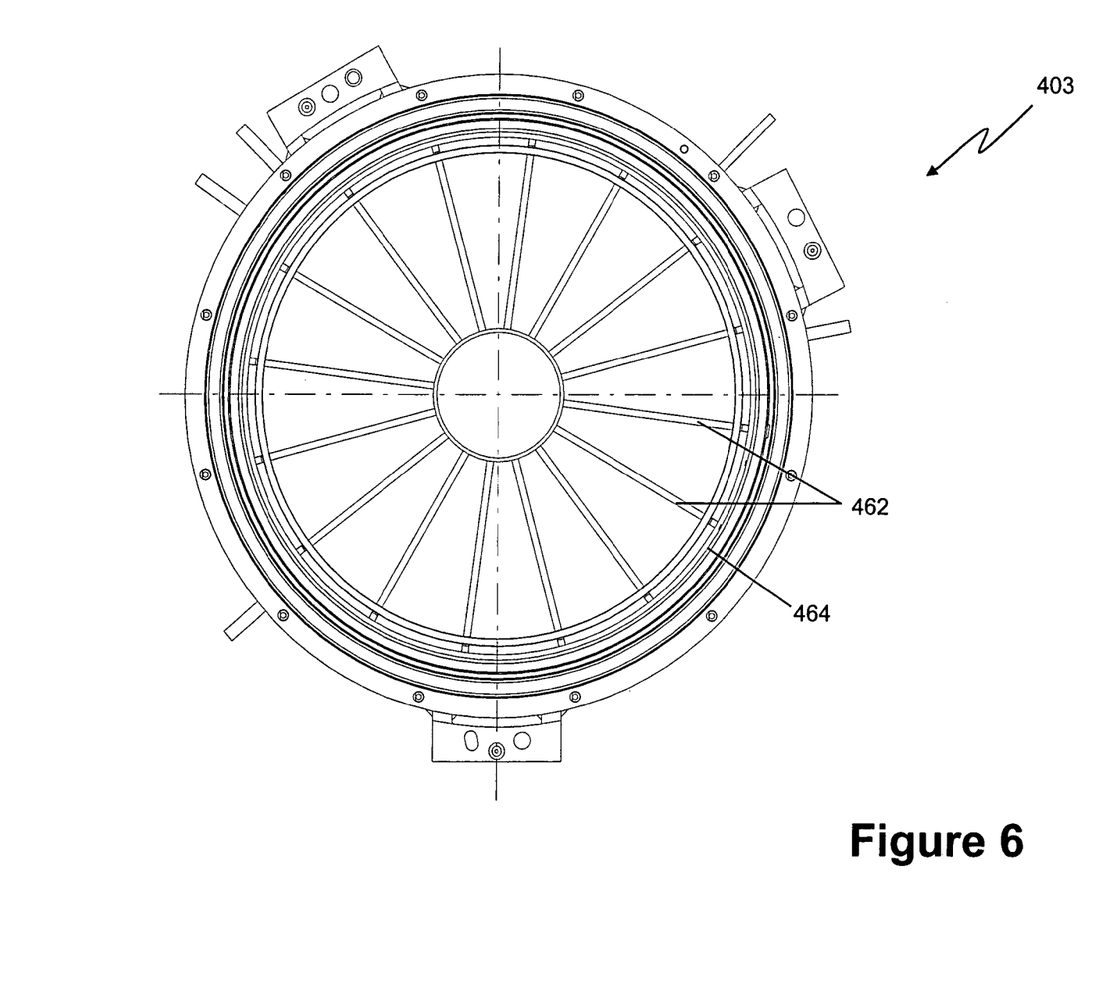
FIG. 6 is a schematic, cross-sectional top-down view of the furnace closure construction of FIG. 4, in accordance with preferred embodiments of the invention.

The annular groove 464 has an opening on the sealing surface 441 of the door plate 440. The lower end of the process tube 400 is provided with a circumferential exhaust channel 408, which is in fluid communication with the exhaust tube 436. The circumferential channel 408 is provided with an annular opening 466 having an opening on the lower sealing surface 401 of the process tube 400. The annular opening 466 is positioned so that when the door plate 440 closes against the process tube 400, the annular opening 466 and the annular groove 464 are in communication with each other. It will be appreciated that, as with the annular groove 464, the annular opening 466 can be replaced by a plurality of separated openings.

During processing, process gas is flowed into the reaction tube 400 through a process gas inlet 402 (FIG. 4) at the top of the reaction chamber 404. Inside the reaction tube 400, process gas moves in a downward direction until it hits the quartz door plate 440. At that point, it moves in a radially inward direction through a gap 443 between the quartz door plate 440 and the lower surface of the rotating quartz plate 444. The process gas moves in the gap 443 toward the exhaust opening 460 proximate a center of the door plate 440. The process gas moves through the opening 460, through the exhaust channels 462, through the annular groove 464, through the annular opening 466 and through exhaust channel 408 to the exhaust tube 436.

Preferably, the flow path(s) of the process gas is provided with a flow restriction 448, which is preferably a protrusion in the door plate 440. The flow restriction 448 is preferably positioned upstream (relative to the flow of process gas) of the exhaust opening 460 to prevent or minimize the flow of purge gas from the sealing chamber 406 into the process chamber 404. Preferably, the flow path of the sealing purge gas is also provided with a flow restriction positioned upstream (relative to the flow of purge gas) of the exhaust opening 460, e.g., positioned at the hole at the center of the door plate 440 through which the rotation bearing 453 protrudes, to prevent or minimize the flow of process gas from the process chamber 404 into the sealing chamber 406. It will be appreciated that both the sealing purge gas flow and the process gas flow meet at the gas exhaust opening 460, and then flow through the gas exhaust channels 462.

With this arrangement, the reaction chamber 404 and the sealing chamber 406 are well-separated from a flow dynamics point of view, thereby leading to many advantages. For example, undesirable exposure of the sealing chamber 406 to process gases is prevented, preventing or minimizing corrosion of the door plate 450 and allowing for processing while maintaining the equipment in a cleaner condition. In addition, an improved symmetry of the flow pattern of the process gases inside the reaction chamber 404 is obtained, allowing for more uniform process results. Moreover, the undesirable and non-homogeneous dilution of process gas in the reaction chamber 404 with purge gases can be prevented. Also, the magnitude of the purge flow can be selected for optimal purging of the sealing chamber 406 and with minimal concern for detrimental effects on the process conditions which may be caused by dilution with the purge gas.

It will be appreciated that, while the furnace closure construction is described with reference to a specific example for ease of description, various details of the illustrated embodiment can be configured differently from the illustrated embodiment. For example, instead of annular groove 464 and annular opening 466, pairs or other numbers of matching vertical channels can be provided to connect each exhaust channel 462 to circumferential channel 408. Alternatively, a single large annular exhaust channel can be provided in the center of the door plate 440, the annular channel being in communication with the exhaust tube 436 through one or more communicating, intervening exhaust channels.

In addition, while the process tubes 300 and 400 are illustrated having a circular horizontal cross-section, the horizontal cross-section can have any shape suitable for accommodating and processing substrates. For purposes of maintaining a symmetric gas flow through the chamber 304, 404, however, the horizontal cross-section is preferably circular.

Various modifications to structures around the door plates 340, 350 and 440, 450 are also possible. For example, the pedestal 310, 410 can be provided with a bleed hole to allow the escape of air when the pedestal heats up and the air inside the pedestal expands. If a bleed hole is provided, the door plate 340, 440 can be provided with an additional exhaust channel, which has an inlet end in communication with the bleed hole and an outlet end in communication with exhaust opening 345, 460. Using this arrangement, escaped air from the bleed hole is guided directly to the exhaust opening 345, 460 without entering reaction chamber 404.

In addition, while one process gas inlet, gas exhaust and purge gas inlet are shown for ease of illustration and manufacturing, it will be appreciated that additional numbers of any of these features can be provided.

Accordingly, it will be appreciated by those skilled in the art that other various omissions, additions and modifications can be made to the processes described above without departing from the scope of the invention. All such modifications and changes are intended to fall within the scope of the invention, as defined by the appended claims.

We claim:

1. A furnace for semiconductor processing, comprising:
   a reaction chamber at least partially delimited by a vertically-extending process tube sized and shaped to accommodate a plurality of vertically separated semiconductor substrates, the process tube provided with a feed for gas and the process tube further having an open end, wherein walls of the process tube proximate the open end are free of passages for exhausting gas; and
   a process tube closure configured to reversibly seal against the process tube to close off the open end, the closure comprising:
   a first door plate having one or more gas exhaust openings, the gas exhaust openings disposed proximate a lateral center of the first door plate and configured to exhaust gases from the reaction chamber, wherein surfaces of the closure define one or more gas exhaust channels below an upper surface of the door plate, the one or more gas exhaust channels configured to communicate gas from the gas exhaust openings to a gas exhaust apparatus configured for removing gases from the reaction chamber.

2. The furnace of claim 1, further comprising a flow restriction upstream of the one or more gas exhaust openings, wherein the flow restriction is configured to substantially prevent diffusion of gas into the reaction chamber through the one or more gas exhaust openings.

3. The furnace of claim 2, wherein the first door plate is a support plate configured to support a substrate holder for holding the plurality of substrate.

4. The furnace of claim 2, further comprising a support plate disposed immediately above the first door plate, the support plate and the first door plate forming a passage to the one or more gas exhaust openings, wherein the flow restriction is disposed in the passage and comprises a protrusion in the first door plate.

5. The furnace of claim 4, wherein the support plate is configured to rotatably support a pedestal for supporting a wafer boat holding the plurality of substrates.

6. The furnace of claim 2, wherein the process tube closure further comprises a second door plate having major surfaces below and spaced from the first door plate, wherein the first door plate forms at least part of the upper walls and the second door plate forms at least part of the lower walls of a sealing chamber in gas communication with the one or more gas exhaust openings.

7. The furnace of claim 6, wherein the sealing chamber has a gas inlet connected to a source of purge gas and a gas outlet for exhausting gas, wherein the one or more gas exhaust openings open to the sealing chamber to discharge gas from the reaction chamber through the gas outlet.

8. The furnace of claim 6, wherein the one or more gas channels extend within the first door plate from the one or more gas exhaust openings and have a termination proximate a perimeter of the first door plate.

9. The furnace of claim 8, further comprising an other flow restriction disposed between the sealing chamber gas inlet and the one or more gas exhaust openings.

10. The furnace of claim 8, wherein the termination comprises at least one opening on a surface of the first door plate, wherein the process tube has an interior exhaust channel having an opening positioned to align with the at least one opening on the surface of the first door plate, the interior exhaust channel connected to the gas exhaust apparatus.

11. The furnace of claim 10, wherein the one or more gas exhaust openings is an annular groove proximate the center of the first door plate, wherein the at least one opening on the surface of the first door plate is an other annular groove in the first door plate proximate the perimeter of the first door plate.

12. The furnace of claim 11, wherein the one or more channels comprises a plurality of gas exhaust channels extending radially outward within the first door plate from the annular groove proximate the center of the first door plate to the other annular groove proximate the perimeter of the first door plate.

13. The furnace of claim 6, wherein the process tube is supported on one or more intervening metal flanges, wherein the metal flanges form sidewalls of the sealing chamber, and wherein the second doorplate is configured to seal against the metal flanges.

14. The furnace of claim 1, further comprising a rotation bearing disposed proximate the center of the first door plate, the rotation bearing configured to rotate a substrate holder for holding the plurality of substrates, wherein the one or more gas exhaust openings are disposed proximate a perimeter of the rotation bearing.

15. The furnace of claim 1, wherein the process tube comprises a gas inlet opening proximate a top of the process tube, the gas inlet connected to a source of process gas, wherein the open end is proximate a bottom of the process tube.

16. The furnace of claim 1, wherein the process tube and the first door plate are formed of quartz.

17. A closure for a semiconductor processing furnace, the closure comprising:

a first door plate configured to seal against a process tube of the furnace, the first door plate provided with one or more gas exhaust channels, wherein surfaces of the closure define one or more gas exhaust channels below an upper surface of the door plate, the one or more gas exhaust channels configured to communicate gas from the gas exhaust openings to a gas exhaust apparatus configured for removing gases from the reaction chamber; and a second door plate below and vertically spaced from the first door plate by one or more spacers, the first and second door plates defining a sealing chamber therebetween, the sealing chamber having an inlet and an outlet proximate perimeters of the first and second doors, wherein the sealing chamber is spaced from the one or more gas exhaust channels.

18. The closure of claim 17, wherein the inlet and outlet are positioned at an angle of approximately 180° relative to one another.

19. The closure of claim 17, further comprising a hole at a center of the second door plate, the hole sized and shaped to accommodate a rotation bearing disposed therethrough.

20. The closure of claim 19, further comprising a hole proximate a center of the first door plate, wherein at least a part of the hole in the first door plate forms at least one opening for exhausting gas.

21. The closure of claim 17, wherein the first door plate comprises an annular protrusion configured to seal against the process tube, the annular protrusion disposed proximate a perimeter of the first door plate.

22. The closure of claim 21, wherein the first door plate comprises an other annular protrusion proximate a center of the first door plate.

23. The closure of claim 17, wherein the first door plate is formed of quartz.

24. A door construction for a reaction tube of a semiconductor processing furnace, the door construction comprising:

a door plate configured to seal against a surface on a bottom portion of the reaction tube, the door plate comprising one or more gas channels extending inside the door plate from proximate a lateral center of the door plate to a termination proximate the perimeter of the door plate, wherein the door plate comprises an annular groove proximate a perimeter of the door plate, wherein the one or more gas channels open to both the central opening and the annular groove and extend radially outward from the central opening to the annular groove.

25. The door construction of claim 24, wherein the door plate comprises a central opening proximate a center of the first door plate.

26. The door construction of claim 24, wherein the annular groove is sized and shaped to align with a circumferential gas channel disposed within the reaction tube.

27. The door construction of claim 26, wherein the one or more gas channels comprise sixteen gas channels extending inside the upper door plate.

28. A door construction for a reaction tube of a semiconductor processing furnace, the door construction comprising:

a door plate configured to seal against a surface on a bottom portion of the reaction tube, the door plate comprising one or more gas channels extending inside the door plate from proximate a lateral center of the door plate to a termination proximate the perimeter of the door plate, wherein the central opening is sized and located to accommodate at least a part of a rotation bearing therein, wherein a perimeter of the central opening extends around and spaced from a perimeter of the rotation bearing upon positioning of the rotation bearing therein.

29. The door construction of claim 28, wherein the first door plate is formed of quartz.

30. The door construction of claim 29, further comprising a lower door plate, wherein major surfaces of the lower door plate are below and separated from the door plate by one or more feet, the door plate and the lower door plate defining at least a part of a sealing chamber therebetween, the sealing chamber having an inlet proximate perimeters of the first and second door plates.

31. The door construction of claim 30, wherein the lower door plate is formed of metal.

32. The door construction of claim 31, wherein the metal is stainless steel.

* * * * *